United States Patent [19]

Bagdasarian et al.

[11] 4,355,290

[45] Oct. 19, 1982

[54] ACOUSTIC SURFACE WAVE FILTER

[76] Inventors: Alexandr S. Bagdasarian, ulitsa Popova,10,kv.12, Fryazino Moskovskoi oblasti; Jury V. Gulyaev, ulitsa Baikalskaya,23,kv.29, Moscow; Anatoly M. Kmita, prospekt Mira,22,kv.231, Fryazino Moskovskoi oblasti, all of U.S.S.R.

[21] Appl. No.: 216,995

[22] PCT Filed: Feb. 29, 1980

[86] PCT No.: PCT/SU80/00037

§ 371 Date: Nov. 21, 1980

§ 102(e) Date: Nov. 6, 1980

[87] PCT Pub. No.: WO80/02090

PCT Pub. Date: Oct. 2, 1980

[30] Foreign Application Priority Data

Mar. 21, 1979 [SU] U.S.S.R. ................ 2733605

[51] Int. Cl.³ ............... H03H 9/64; H03H 9/25
[52] U.S. Cl. ........................ 333/195; 333/196
[58] Field of Search ....................... 333/150–155, 333/193–196; 310/313 R, 313 A, 313 B, 313 C, 313 D; 331/107 A; 330/5.5

[56] References Cited

U.S. PATENT DOCUMENTS 3,987,379 10/1976 DeVries .............. 310/313 D X
4,004,254 1/1977 DeVries .............. 310/313 D X
4,162,415 7/1979 Andreev et al. ........... 333/150 X Primary Examiner—Marvin L. Nussbaum
Attorney, Agent, or Firm—Lilling & Greenspan

[57] ABSTRACT

An acoustic surface wave filter includes a coupling element to transmit acoustic surface waves from a first acoustic channel to a second acoustic channel and simultaneously form the amplitude-frequency characteristic of the filter. The coupling element comprises two rows of electrodes. Each of these rows is arranged in a respective acoustic channel and has two group of electrodes which are respectively arranged parallel with electrodes of an input interdigitated converter and an output interdigitated converter, respectively, which are arranged in the first acoustic channel and the second acoustic channel, respectively. The electrodes of the first group of each row of the coupling element are respectively arranged between the electrodes of the second group of the same row and both form overlapping portions of a variable length in at least one row; this row corresponds to the row of electrodes of the input converter having overlapping portions of a constant length. The electrodes of the first group of the first row of the coupling element are galvanically interconnected and galvanically connected to the electrodes of the first group of the second row; each electrode of the remaining group of the first row has direct galvanic coupling with the respective electrode of the remaining group of the second row.

1 Claim, 3 Drawing Figures

ACOUSTIC SURFACE WAVE FILTER

The present invention relates to filters and, more particularly, to acoustic surface wave filters.

DESCRIPTION OF THE PRIOR ART

There is known an acoustic surface wave filter comprising a piezoelectric substrate which carries an input interdigitated converter with electrodes having overlapping portions to produce acoustic surface waves for propagation in a first acoustic channel, a coupling element to transmit acoustic surface waves from the first acoustic channel to a second acoustic channel, and an output interdigitated converter with electrodes having overlapping portions to receive acoustic surface waves propagating in the second acoustic channel (cf. U.S. Pat. No. 3,836,876, of Sept. 17, 1974).

In this filter, the coupling element is a multistrip system of electrodes whereof each overlaps both acoustic channels. The electrode portions in one channel are parallel with those in the other channel and orthogonally oriented to the direction of acoustic surface wave propagation in this channel.

Both converters of the filter under review may have electrodes with overlapping portions of a variable length. As a result, the amplitude-frequency characteristic of the filter can be formed both by the input and output converter. The resultant amplitude-frequency characteristic of such a filter is the product of the amplitude-frequency characteristics formed by the input and output converters.

In cases requiring a high level of signal suppression beyond the filter passband, the amplitude-frequency characteristic of the filter under review turns out to be unsatisfactory. Besides, this filter can be manufactured only from a limited range of materials, because the multistrip electrode system of its coupling element can only be arranged on substrates of piezoelectric materials possessing a high electromechanical coupling constant, such as lithium niobate. If the substrate is of a material possessing a relatively low electromechanical coupling constant, such as quartz, an exorbitant number of electrodes is required in the multistrip system to ensure effective transmission of acoustic surface waves from one channel to the other.

There is further known an acoustic surface wave device which can employ a substrate of any piezoelectric material. The coupling element of this device comprises a system of electrodes whereof each is galvanically coupled to every other electrode (cf. UP Pat. No. 1,389,023, Cl. H3U, of Apr. 3, 1975).

Like the above filter, the amplitude-frequency characteristic of this device is often unsatisfactory, because it is formed only by the acoustic surface wave converters incorporated in the device.

There is known an acoustic surface wave filter whose amplitude-frequency characteristic is much better than that of the filter and device described above.

This filter comprises a piezoelectric substrate which carries an input interdigitated converter with electrodes having overlapping portions to produce acoustic surface waves for propagation in a first acoustic channel, a coupling element to transmit acoustic surface waves from the first channel to a second acoustic channel and simultaneously form the amplitude-frequency characteristic of the filter, and an output interdigitated converter with electrodes having overlapping portions to receive acoustic surface waves propagating in the second acoustic channel (cf. Application No. 2,003,353, Cl. H3U, advertized by the British patent office on Mar. 7, 1979).

The coupling element of this filter comprises a first row of electrodes, which is arranged in the first acoustic channel and composed of a first group of electrodes and a second group of electrodes; these are parallel with the electrodes of the input converter and arranged so that the electrodes of the second group are interposed between those of the first group so as to form overlapping portions. The coupling element further contains a second row of electrodes which is arranged in the second acoustic channel and composed of a third group of electrodes and a fourth group of electrodes that are parallel with the electrodes of the output converter and arranged so that the electrodes of the fourth group are interposed between those of the third group and form overlapping portions. The coupling element contains a third row of electrodes which is interposed between the first and second rows and composed of a fifth group and a sixth group of parallel electrodes arranged so that the electrodes of the sixth group are interposed between those of the fifth group to form overlapping portions of a variable length determined by a prescribed pulse response of the filter; the distance between the longitudinal axes of adjacent electrodes of the third row is different from the distance between the longitudinal axes of adjacent electrodes of the first and second rows. The electrode of the first and third groups are galvanically coupled to one another by means of a current-conducting bus; the electrodes of the second and fourth groups have direct galvanic coupling to the electrodes of the fifth and sixth groups, respectively. In the coupling element, the electrodes of the first and second rows have overlapping portions of a constant length. The overlapping portions of the electrodes of the input and output converters may be of a constant or variable length.

In this filter, a prescribed amplitude-frequency characteristic is formed by the first and second rows of electrodes of the coupling element; this means that converters with a variable length of overlapping electrode portions account for a substantial improvement of the amplitude-frequency characteristic, as compared to filters and devices of the types described above.

However, the presence in the coupling element of the third row of electrodes, which is necessary to enable the electrodes of the first and second rows to form the amplitude-frequency characteristic of the filter, accounts for a great size of the filter which, in turn, leads to complications in the manufacture of the filter and an unjustifiably large consumption of the piezoelectric substrate material.

SUMMARY OF THE INVENTION

It is an object of the present invention to provide an acoustic surface wave filter, wherein the design of the coupling element, which serves to transmit acoustic surface waves from the first acoustic channel to the second and simultaneously form the amplitude-frequency characteristic of the filter, would help reduce the size of the filter as a whole.

The foregoing object is attained by an acoustic surface wave filter comprising a piezoelectric substrate carrying an input interdigitated converter with electrodes having overlapping portions to produce acoustic surface waves for propagation in a first acoustic channel, a coupling element to transmit acoustic surface waves from the first acoustic channel to a second acoustic channel and simultaneously form the amplitude-frequency characteristic of the filter, and an output interdigitated converter with electrodes having overlapping portions to receive acoustic surface waves propagating in the second acoustic channel. In accordance with the invention, the coupling element contains two rows of electrodes whereof each is arranged in a respective acoustic channel and has two groups of electrodes parallel with those of the respective converter and arranged so that the electrodes of one group are interposed between those of the other group, both forming overlapping portions of electrodes of both groups of a variable length in at least one row, which length is determined by a prescribed pulse response of the filter. The electrodes of the converter, arranged in the same acoustic channel as the row of electrodes of the coupling element, and having overlapping portions of a variable length, have overlapping portions of a constant length. The electrodes of the first group of the first row of the coupling element being galvanically interconnected and galvanically connected to the electrodes of the first group of the second row, each electrode of the remaining group of the first row having direct galvanic coupling to the respective electrode of the remaining group of the second row.

The proposed filter design makes it possible to substantially reduce the size of the filter, while making it possible for the input and output converters and for the coupling element to form the filter's amplitude-frequency characteristic and thus improve said amplitude-frequency characteristic of said filter.

BRIEF DESCRIPTION OF THE DRAWINGS

Other objects and advantages of the present invention will become more apparent from the following detailed description of preferred embodiments thereof, taken in conjunction with the accompanying drawings, wherein.

DETAILED DESCRIPTION OF THE INVENTION

Figure 1:
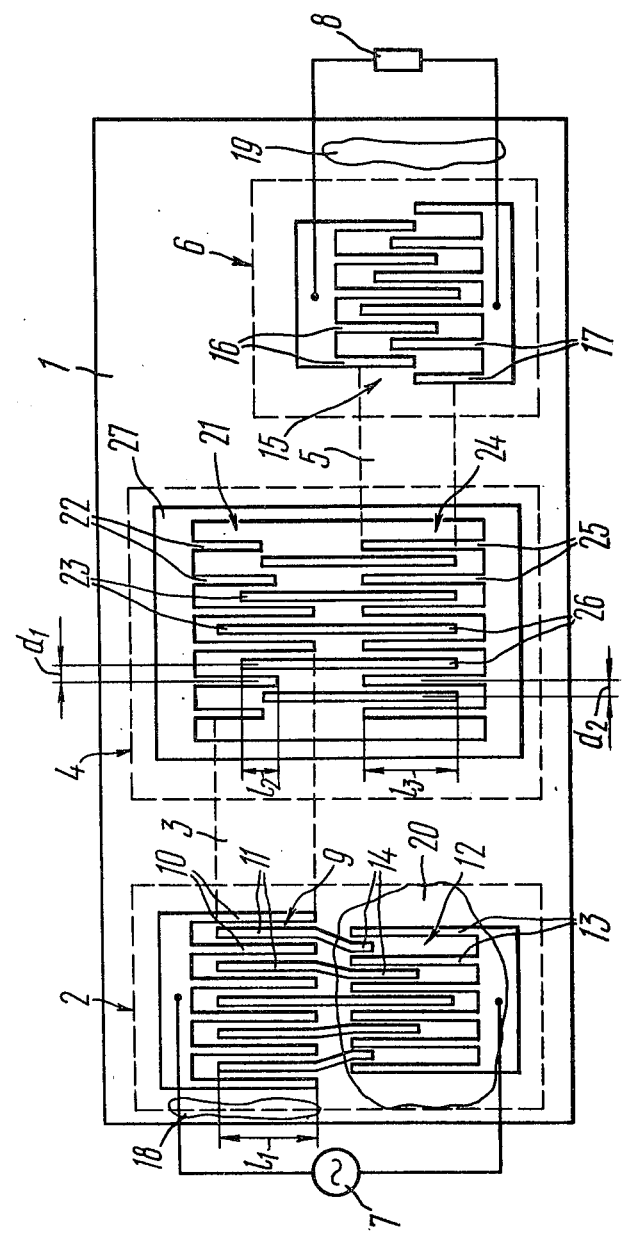
FIG. 1 is a plan view of a filter in accordance with the invention.

According to the invention, the acoustic surface wave filter comprises a piezoelectric substrate (FIG. 1) which carries an input interdigitated converter 2 to produce acoustic surface waves to propagate in a first acoustic channel 3, a coupling element 4 to transmit acoustic surface waves from the first acoustic channel 3 to a second acoustic channel 5 and simultaneously form the amplitude-frequency characteristic of the filter, and an output interdigitated converter 6 to receive acoustic surface waves propagating in the channel 5.

The input converter 2 and output converter 5 are respectively connected to a high-frequency signal generator 7 and a load 8.

The input converter 2 is of the design disclosed in patent application No. 2,003,389, Cl. H3U, advertized by the British patent office on Mar. 14, 1979. It comprises a row 9 of electrodes 10 and 11, having overlapping portions of a constant length $l_1$, and a row 12 of electrodes 13 and 14, having overlapping portions of a variable length.

The output converter 6 is of the well-known type and comprises a row 15 of electrodes 16 and 17 having overlapping portions of a variable length.

Arranged at the ends of the substrate 1 and on the row 12 of the electrodes 13 and 14 of the input converter 2 are absorbers 18, 19 and 20, respectively.

The coupling element 4 comprises a first row 21 of electrodes 22 and 23 and a second row 24 of electrodes 25 and 26. The row 21 of electrodes 22 and 23 is arranged in the same acoustic channel 3 as the electrodes 10 and 11 of the row 9 of the input converter 2 and is composed of the first group of electrodes 22 and the second group of electrodes 23. The electrodes 22 and 23 are parallel with the electrodes 10 and 11 of the row 9 of the input converter 2 and arranged so that the electrodes 23 are interposed between the electrodes 22, both forming portions of a variable length $l_2$ determined by a prescribed pulse response of the filter.

The maximum value of $l_2$ is equal to the length $l_1$ of the overlapping portions of the electrodes 10 and 11 of the row 9 of the input converter 2.

The row 24 of electrodes 25 and 26 is arranged in the same acoustic channel 5 as the electrodes 16 and 17 of the row 15 of the output converter 6 and is composed of the first group of electrodes 25 and the second group of electrodes 26. The electrodes 25 and 26 are parallel with the electrodes 16 and 17 of the row 15 of the output converter 6 and arranged so that the electrodes 26 are interposed between the electrodes 25, both forming overlapping portions of a constant length $l_3$ which is equal to the maximum length of the overlapping portions of the electrodes 16 and 17 of the output converter 6.

In the embodiment under review, the electrodes 10 and 11 of the row 9 of the input converter 2 are arranged in the same acoustic channel 3 as the row 21 of electrodes 22 and 24 of the coupling element 4, which have overlapping portions of a variable length $l_3$; the electrodes 10 and 11 have overlapping portions of a constant length $l_1$.

The electrodes 22 are galvanically coupled to one another and to the electrodes 25 by means of a current-carrying bus 27. Each electrode 23 has direct galvanic coupling to the respective electrode 26. The current-carrying bus 27 is a closed loop which is grounded and encompasses the rows 21 and 24 of electrodes 22 and 23 and 25 and 26.

The distances $d_1$ and $d_2$ between the longitudinal axes of the adjacent electrodes 22 and 23 and 25 and 26 (further referred to as spatial periods $d_1$ and $d_2$) are equal to the spatial period of the electrodes 10 and 11 of the row 9 of the input converter 2 and the electrodes 16 and 17 of the output converter 6; the spatial periods $d_1$ and $d_2$ are selected on the basis of acoustic synchronism, i.e. they are derived from the following equation:

$$d_1 = d_2 = (V/2f_o, \tag{1}$$

where V is the speed of propagation of acoustic surface waves; and $f_o$ is the center frequency of the filter.

The spatial periods $d_1$ and $d_2$ of the rows 21 and 24 of electrodes 22 and 23 and 25 and 26 may be selected on the basis of acoustical synchronism in odd harmonics, i.e. they are derived from the following equations:

$$d_1 = (V/2f_o)(2m+1), \tag{2}$$

$$d_2 = (V/2f_i)(2n+1), \qquad (3)$$

where $m, n = 0, 1, 2, 3 \ldots$

Besides, the distances $d_1$ and $d_2$ between the longitudinal axes of adjacent electrodes 22 and 23 and 25 and 26 may vary along the row according to a predetermined pattern as in the known coupling elements of the dispersion type (cf. UK patent specification No. 1,492,766, Cl. H3U, of Nov. 23, 1975). In such cases, $d_1$ and $d_2$ are determined with reference to the center frequency $f_o$ and passband of the filter.

In some instances, for example, during the formation of an asymmetrical amplitude-frequency characteristic, the spatial periods $d_1$ and $d_2$ may differ somewhat from each other and/or from the spatial periods of the electrodes 10 and 11 of the row 9 of the input converter 2 and the electrodes 16 and 17 of the output converter 6. The spatial periods $d_1$ and $d_2$ are selected so that the frequency bands of effective excitation of surface acoustical waves by the electrodes 10 and 11 of the row 9 of the converter 2 and by the electrodes 25 and 26 of the row 24 of the coupling element 4, as well as the frequency bands of reception of acoustic surface waves by the electrodes 22 and 23 of the row 21 of the coupling element 4 and by the electrodes 16 and 17 of the converter 6, are all within the passband of the filter.

Figure 2:
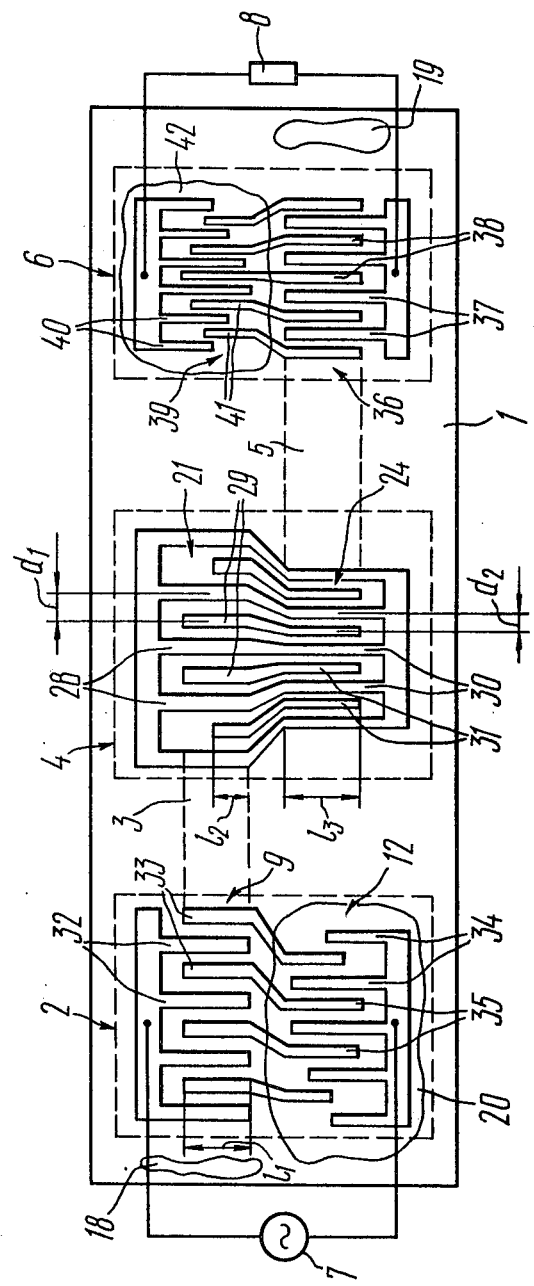
FIG. 2 is a plan view of an alternative embodiment of the filter in accordance with the invention.

An embodiment of such a filter is shown in FIG. 2. In this embodiment, the spatial period $d_1$ of electrodes 28 and 29 of the row 21 of the coupling element 4 differs from the spatial period $d_2$ of electrodes 30 and 31 of the row 24 and is equal to the spatial period of electrodes 32 and 33 of the row 9 of the input converter 2.

Unlike the filter of FIG. 1, the electrodes 28 of the coupling element 4 are interconnected and coupled to the electrodes 30 interconnected so that each electrode 28 has direct galvanic coupling with the respective electrode 30.

As in the filter of FIG. 1, the electrodes 32 and 33 of the row 9 of the input converter 2 of the filter according to FIG. 2 are arranged in the same acoustical channel 3 as the row 21 of electrodes 28 and 29 of the coupling element 4, both having overlapping portions of a variable length $l_2$; the electrodes 32 and 33 have overlapping portions of a constant length $l_1$; and, electrodes 34 and 35 of the row 12 have overlapping portions of a variable length.

In the embodiment of FIG. 2, the output converter 6 is similar to the input converter 2 and comprises a row 36 of electrodes 37 and 38 with overlapping portions of a constant length; the converter 6 further contains a row 39 of electrodes 40 and 41 with overlapping portions of a variable length; the row 39 carries a surface acoustical wave absorber 42.

The row 36 of electrodes 37 and 38 is arranged in the same acoustic channel 5 as the electrodes 30 and 31 of the row 24 of the coupling element 4; the length of the overlapping portions of the electrode 37 and 38 is equal to the length $l_3$ of the overlapping portions of the electrodes 30 and 31.

In the above embodiments, the electrodes of only one row of the coupling element 4 have overlapping portions of a variable length; the electrodes of the other row of the coupling element 4 have overlapping portions of a constant length. Besides, the electrodes of both rows may have overlapping portions of a variable length, determined by a prescribed pulse response of the filter. In the latter case the row of electrodes of the output converter is arranged in the same acoustic channel as the row of electrodes of the coupling element having overlapping portions of a variable length; the overlapping portions of electrodes of the output converter are of a constant length.

The operating principle of the filter according to the invention is as follows.

A high-frequency signal produced by the generator 7 (FIG. 1) is applied to the input converter 2 and converted to acoustic surface waves with a uniform front, which propagate in the sound beam aperture in the first acoustic channel 3. Upon reaching the row 21 of electrodes 22 and 23 of the coupling element 4, the acoustic surface waves produce a difference of potentials of alternating sign at each pair of adjacent electrodes 22 and 23 of both groups. Each pair of electrodes 22 and 23 may be regarded as a high-frequency signal source whose load is the respective adjacent pair of electrodes 25, 26 of the row 24.

As the high-frequency signal is applied to the electrodes 25 and 26 of the row 24, it is reconverted to acoustic surface waves which propagate in the second acoustic channel 5. Upon reaching the output converter 5, the acoustic surface waves are again converted to a high-frequency signal at the load 8.

The voltage of the signal at each pair of adjacent electrodes 22 and 23 of the row 21 is determined by the length $l_2$ of the overlapping portions of these electrodes; on the other hand, this voltage is determined by the ratio of the capacitances between the electrodes of this pair and the respective pair of electrodes 25 and 26, which ratio is also determined by $l_2$. Thus by varying the length $l_2$ of the overlapping portions of the electrodes 22 and 23 of the row 21 it is possible to have a desired value of voltage across each pair of adjacent electrodes of this row, i.e. produce a desired pulse response of the filter.

Weighted voltages are applied to the electrodes 25 and 26 of the row 24 from the respective electrodes of the row 21; thus the intensity of acoustic surface waves produced by the adjacent electrodes of the row 24 is also weighted. In other words, the excitation of acoustic surface waves by the electrodes 25 and 26 of the row 24 is also accompanied by the formation of a predetermined pulse response. The acoustic surface waves produced by the electrodes of the row 24 have a uniform front over the sound beam aperture; as the acoustic surface waves reach the electrodes 16 and 17 with a variable length of overlapping portions of the output converter 6, they are converted to a high-frequency signal without phase distortions.

The operating principle of the filter of FIG. 1 is similar to that of the filter of FIG. 1.

In order to calculate the filter of FIG. 1, one first calculates the amplitude-frequency characteristics of the input converter 2, the output converter 6 and the coupling element 4. The amplitude-frequency characteristic of the filter as a whole is the product of all these frequency-amplitude characteristics.

In order to calculate the filter of FIG. 2, one must determine the change of the overlapping portions of the electrodes in the row 12 along the converter (cf. U.S. Pat. No. 4,162,415, Cl. 310–313, of July 24, 1979).

The calculation of the output converter 6 is carried out in the known manner by determining the apodization pattern (cf. Proceedings of the IEEE, v. 59, No. 3, 1971, New York, R. M. Tancrell, M. G. Holland, "Acoustic Surface Wave Filters," p. 393).

The calculation of the coupling element 4 consists in determining the change along the element 4 of the length $l_2$ of the overlapping portions of the electrodes 22 and 23 of the row 21. Such a calculation may be performed with the aid of an equivalent circuit for the pair of adjacent electrodes 25 and 26.

Figure 3:
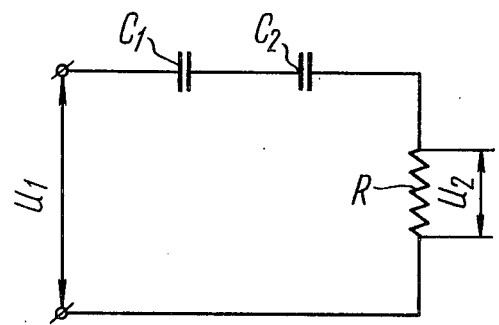
FIG. 3 is an equivalent electric circuit diagram for a pair of adjacent electrodes of one of the rows of the coupling element employed in the filter of FIG. 1.

FIG. 3 shows, by way of an example, an equivalent circuit for the pair of adjacent electrodes 25 and 26 (FIG. 1) of the row 24. In FIG. 3, $C_1$ is the capacitance of the pair of adjacent electrodes 22 and 23 of the row 21; $C_2$ and R are the radiation capacitance and resistance, respectively, of the pair of adjacent electrodes 25 and 26 of the row 24. The amplitude of the pulse response formed in the row 24 of the coupling element 4 is proportional to the length $l_3$ of the overlapping portions of the adjacent electrodes 25 and 26 and to voltage $U_2$ which is derived from the following formula:

$$U_2 = \frac{U_1 R}{\left[ R^2 + \frac{1}{2\pi f_o} \left( \frac{1}{C_1} + \frac{1}{C_2} \right) \right]^{\frac{1}{2}}}, \quad (4)$$

where $U_1$ is high-frequency voltage applied to the pair of electrodes 25 and 26 of the row 24 on the side of the respective pair of electrodes 22 and 23 of the row 21.

Similarly, the amplitude of the pulse respond formed in the row 21 of the coupling element 4 is proportional to the length $l_2$ of the overlapping portions of the adjacent electrodes 22 and 23 of the row 21 and to high-frequency voltage $U_1$ produced between these electrodes; voltage $U_1$ is determined with the aid of a similar equivalent circuit.

The pulse response of the coupling element 4 is determined from its amplitude-frequency characteristic. The pulse response and the above formula are used to find the ratio between the voltages and calculate $C_1$. Then one determines the length $l_2$ of the overlapping portions of the electrodes 22 and 23 of the row 21.

The calculation of the filter of FIG. 2 is similar to the calculation of the filter of FIG. 1; the only difference is that the output converter 6 is calculated as the input converter 2.

The filter according to the invention is advantageous in that it has a small size, while making it possible to form the amplitude-frequency characteristic both by the input and output converters and by the coupling element. The reduced size of the filter facilitates the manufacture of photomasks for the filter and improves the resolution of photomasking, which reduces the amount of rejects. The filter according to the invention is cheaper than its predecessors, because its manufacture does not require as much substrate material.

Commercial Applicability

The acoustic surface wave filter according to the invention is applicable to frequency selection of radio signals in data processing systems and devices.

We claim:

1. An acoustic surface filter comprising a piezoelectric substrate carrying an input interdigitated converter with electrodes having overlapping portions producing acoustic surface waves for propagation in a first acoustic channel; a coupling element transmitting acoustic surface waves from the first acoustic channel to a second acoustic channel and simultaneously forming the amplitude-frequency characteristic of the filter; and an output interdigitated converter with electrodes having overlapping portions receiving acoustic surface waves propagating in the second acoustic channel; wherein the coupling element contains two rows of electrodes whereof each is arranged in a respective acoustic channel and has two groups of electrodes parallel with the electrodes of the respective converter and arrranged so that the electrodes of one group are interposed between the electrodes of the other group, both forming overlapping portions of the electrodes of both groups of a variable length in at least one row, said length being determined by a prescribed pulse response of the filter, the electrodes of the converter arranged in the same acoustic channel as the row of electrodes of the coupling element, and having overlapping portions of a variable length, have overlapping portions of the electrodes of a constant length, the electrodes of one group of one row of the coupling element being galvanically interconnected and galvanically coupled to the electrodes of one group of another row, each electrode of the remaining group of one row having direct galvanic coupling to the respective electrode of the remaining group of the other row.

* * * * *